United States Patent
Nam et al.

(10) Patent No.: US 9,691,971 B2
(45) Date of Patent: Jun. 27, 2017

(54) INTEGRATED CIRCUITS INCLUDING MAGNETIC TUNNEL JUNCTIONS FOR MAGNETORESISTIVE RANDOM-ACCESS MEMORY AND METHODS FOR FABRICATING THE SAME

(71) Applicant: GLOBALFOUNDRIES, Inc., Grand Cayman (KY)

(72) Inventors: Seowoo Nam, Delmar, NY (US); Ming He, Slingerlands, NY (US); Craig Child, Wilton, NY (US); Hyun-Jin Cho, Palo Alto, CA (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/749,165

(22) Filed: Jun. 24, 2015

(65) Prior Publication Data

US 2016/0190207 A1 Jun. 30, 2016

Related U.S. Application Data

(60) Provisional application No. 62/097,637, filed on Dec. 30, 2014.

(51) Int. Cl.
*H01L 43/12* (2006.01)
*H01L 43/02* (2006.01)
(Continued)

(52) U.S. Cl.
CPC .............. *H01L 43/12* (2013.01); *H01L 43/02* (2013.01); *H01L 43/08* (2013.01); *H01L 27/228* (2013.01); *H01L 2924/0002* (2013.01)

(58) Field of Classification Search
CPC ............ H01L 27/222; H01L 21/76802; H01L 21/7684; H01L 21/7685; H01L 21/76873;
(Continued)

(56) References Cited

U.S. PATENT DOCUMENTS 8,981,440 B2* 3/2015 Nakao ............... H01L 21/76849
257/295
9,472,753 B1* 10/2016 Katine .................... H01L 43/12
(Continued)

OTHER PUBLICATIONS

Embedded MRAM Process, Everspin Technologies The MRAM Company, 1 page, downloaded from www.everspin.com/technology.php?qtype_5, Dec. 30, 2014.
(Continued)

*Primary Examiner* — William F Kraig
*Assistant Examiner* — Khatib Rahman
(74) *Attorney, Agent, or Firm* — Lorenz & Kopf, LLP

(57) ABSTRACT

Integrated circuits that include a magnetic tunnel junction (MTJ) for a magnetoresistive random-access memory (MRAM) and methods for fabricating such integrated circuits are provided. In one example, a method for fabricating an integrated circuit includes forming a lower electrode on a metal interconnect. The metal interconnect is disposed above a semiconductor substrate and is aligned with a normal axis that is substantially perpendicular to the semiconductor substrate. The lower electrode includes a conductive metal plug. A MTJ stack is formed on the lower electrode aligned with the normal axis.

18 Claims, 8 Drawing Sheets

(51) Int. Cl.
*H01L 43/08* (2006.01)
*H01L 27/22* (2006.01)

(58) Field of Classification Search
CPC ............ H01L 21/76879; H01L 23/528; H01L 23/53238; H01L 43/02; H01L 43/08; H01L 43/12
See application file for complete search history.

(56) References Cited

U.S. PATENT DOCUMENTS

| | | | |
|---|---|---|---|
| 2006/0022286 A1* | 2/2006 | Leuschner | H01L 21/76852 257/421 |
| 2007/0281427 A1 | 12/2007 | Cao et al. | |
| 2008/0308937 A1* | 12/2008 | Catabay | H01L 23/53223 257/751 |
| 2009/0261434 A1 | 10/2009 | King et al. | |
| 2010/0193850 A1* | 8/2010 | Asao | H01L 27/228 257/295 |
| 2010/0200900 A1* | 8/2010 | Iwayama | B82Y 25/00 257/295 |
| 2013/0052752 A1 | 2/2013 | Satoh et al. | |
| 2013/0075840 A1 | 3/2013 | Satoh et al. | |
| 2013/0099335 A1* | 4/2013 | Chi | H01L 43/08 257/421 |
| 2013/0267042 A1 | 10/2013 | Satoh et al. | |
| 2014/0254255 A1 | 9/2014 | Mani | |
| 2014/0291789 A1 | 10/2014 | Zeng | |

OTHER PUBLICATIONS

Oh et al., "On-Axis Scheme and Novel MTJ Structure for Sub-30nm Gb Density STT-MRAM", IEEE, 2010, pp. 12.6.1-12.6.4.
Slaughter, "Toggle and Spin-Torque MRAM: Status and Outlook", J. Magnetic Society of Japan, 2010, pp. 171-176, v.5.
U.S. Appl. No. 14/261,543, filed Apr. 25, 2014, 31 pages.
U.S. Appl. No. 14/586,415, filed Dec. 30, 2014, 28 pages.

* cited by examiner

INTEGRATED CIRCUITS INCLUDING MAGNETIC TUNNEL JUNCTIONS FOR MAGNETORESISTIVE RANDOM-ACCESS MEMORY AND METHODS FOR FABRICATING THE SAME

CROSS-REFERENCE TO RELATED APPLICATION

This Application claims the benefit of priority to U.S. Provisional Application Ser. No. 62/097,637, which was filed on Dec. 30, 2014 the contents of which are incorporated herein by reference in their entirety.

TECHNICAL FIELD

The technical field relates generally to integrated circuits and methods for fabricating integrated circuits, and more particularly relates to integrated circuits including a magnetic tunnel junction (MTJ) stack for a magnetoresistive random-access memory (MRAM) and methods for fabricating such integrated circuits.

BACKGROUND

Integrated circuits (ICs) typically include a plurality of semiconductor devices, such as metal oxide semiconductor field effect transistors (MOSFETs) or MOS transistors, over a semiconductor substrate and interconnect wiring. Networks of metal interconnect wiring are often used to connect the semiconductor devices from the semiconductor portion of the substrate. Multiple levels of metal interconnect wiring form a plurality of metallization layers above the semiconductor portion of the substrate and are connected together to form a back-end-of-the-line ("BEOL") interconnect structure. Within such a structure, metal lines run parallel to the substrate in the metallization layers and conductive vias run perpendicular to the substrate between the metallization layers to selectively interconnect the metal lines.

Magnetoresistive random-access memory (MRAM) is a non-volatile random-access memory technology that can be incorporated into ICs and has been under development since the 1990s. A typical MRAM device stores data by means of magnetic storage elements, not in electrical charge or current. The storage elements are formed from two ferromagnetic plates, each of which can hold a magnetic field. The ferromagnetic plates are separated by a thin insulating layer. One of the two plates is a permanent magnet set to a particular polarity, and the other plate's field can be changed to match an external field to store memory.

One kind of MRAM stores data in a magnetic tunnel junction (MTJ) that is configured as a layered memory stack (MTJ stack). The MTJ stack has two magnetic films, that is, a pinned layer and a free layer. The magnetization direction of the pinned layer is fixed while the magnetization direction of the free layer can rotate freely for storing information. There is an insulating layer between the pinned layer and a free layer.

MTJ stacks are often inserted into the BEOL of a complementary MOS (CMOS) process. FIG. 1 illustrates an IC 2 that includes a MTJ stack 4 that is arranged in an interlayer dielectric (ILD) layer or layers 6 of dielectric material(s) of a BEOL interconnect structure 8 above a semiconductor substrate 10. The MTJ stack 4 includes a pinned layer 12, a free layer 14, and an interposing insulating layer 16 and is formed on top of a distal end portion 17 of an extended bottom electrode 18. At its proximal end portion 19, the extended bottom electrode 18 is electrically coupled to a MOS transistor 20 by a conductive stud 22 that includes one or more axially aligned (e.g., vertically aligned) vias and/or metal interconnects 24 that together form a conductive column structure. Also shown in FIG. 1 are metal lines 26 and 28 (e.g., bit and word lines, respectively) that may be formed independently along separate but parallel metallization layers.

Currently, the extended bottom electrode 18 may include various materials, such as, for example, a tantalum nitride/tantalum stack that forms a bi-layer extended bottom electrode. This bi-layer extended bottom electrode has some potential issues however for MRAM applications such as having relatively high resistance, which in turn affects the MRAM electrical performance. Thus, a major challenge for making a successful MRAM is how to integrate a bottom electrode with an overlying MTJ stack within a CMOS BEOL process. To improve electrical performance, a bottom electrode with relatively low sheet resistance and low contact resistance with the underlying metal interconnect of the conductive stud and the overlying MTJ stack is desirable.

Accordingly, it is desirable to provide methods for fabricating integrated circuits including a magnetic tunnel junction (MTJ) for a magnetoresistive random-access memory (MRAM) with improved electrical performance of a bottom electrode with a metal interconnect and a MTJ stack, and integrated circuits formed by such methods. Furthermore, other desirable features and characteristics of the present invention will become apparent from the subsequent detailed description and the appended claims, taken in conjunction with the accompanying drawings and this background.

BRIEF SUMMARY

Integrated circuits that include a magnetic tunnel junction (MTJ) for a magnetoresistive random-access memory (MRAM) and methods for fabricating such integrated circuits are provided herein. In accordance with an exemplary embodiment, a method for fabricating an integrated circuit includes forming a lower electrode on a metal interconnect. The metal interconnect is disposed above a semiconductor substrate and is aligned with a normal axis that is substantially perpendicular to the semiconductor substrate. The lower electrode includes a conductive metal plug. A MTJ stack is formed on the lower electrode aligned with the normal axis.

In accordance with another exemplary embodiment, a method for fabricating an integrated circuit that include a magnetic tunnel junction (MTJ) for a magnetoresistive random-access memory (MRAM) is provided. The method includes etching a hole through a dielectric layer for exposing an upper surface of a metal interconnect. The metal interconnect is disposed above a semiconductor substrate and is aligned with a normal axis that is substantially perpendicular to the semiconductor substrate. A barrier layer is deposited into the hole overlying the upper surface of the metal interconnect. A liner layer is deposited into the hole overlying the barrier layer. A conductive metal plug is formed in the hole overlying the barrier and liner layers and aligned with the normal axis. A tantalum-containing layer is deposited overlying the conductive metal plug. The barrier layer, the liner layer, the conductive metal plug, and the tantalum-containing layer form a lower electrode. A MTJ stack is formed on the lower electrode. A metal line is formed overlying the MTJ stack.

In accordance with another exemplary embodiment, an integrated circuit that include a magnetic tunnel junction (MTJ) for a magnetoresistive random-access memory (MRAM) is provided. The integrated circuit includes a semiconductor substrate. A metal interconnect is disposed above the semiconductor substrate and is aligned with a normal axis that is substantially perpendicular to the semiconductor substrate. A lower electrode is disposed on the metal interconnect and includes a conductive metal plug. A magnetic tunnel junction (MTJ) stack is disposed on the lower electrode aligned with the normal axis.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to integrated circuits that include a magnetic tunnel junction (MTJ) for a magnetoresistive random-access memory (MRAM) and methods for fabricating such integrated circuits. The exemplary embodiments taught herein include forming a lower electrode on a metal interconnect. The metal interconnect is disposed above a semiconductor substrate and is aligned with a normal axis that is substantially perpendicular to the semiconductor substrate. In an exemplary embodiment, the metal interconnect forms an upper portion of a conductive stud that is arranged in a dielectric material of a back-end-of-the-line ("BEOL") interconnect structure and that is electrically coupled to a transistor that is disposed on the semiconductor substrate. The lower electrode includes a conductive metal plug. In an exemplary embodiment, the conductive metal plug is formed of a highly conductive metal such as copper and is formed directly over the metal interconnect aligned with the normal axis. A MTJ stack is formed on the lower electrode aligned with the normal axis. In an exemplary embodiment, it has been found that by forming the lower electrode that includes the conductive metal plug formed of the highly conductive metal and further, by having the MTJ stack and the metal interconnect electrically coupled to and aligned with the conductive metal plug along the normal axis, the lower electrode has relatively less film resistance and relatively lower contact resistance with the metal interconnect and the MTJ stack compared to conventional extended bottom electrodes for MTJ/MRAM applications, thereby improving electrical performance of the MTJ/MRAM application.

FIGS. 2-15 illustrate, in cross-sectional view, an integrated circuit (IC) during various fabrication stages. The described process steps, procedures, and materials are to be considered only as exemplary embodiments designed to illustrate to one of ordinary skill in the art methods for practicing the invention; the invention is not limited to these exemplary embodiments. Various steps in the manufacture of ICs are well known and so, in the interest of brevity, many conventional steps will only be mentioned briefly herein or will be omitted entirely without providing the well-known process details.

Figure 1:
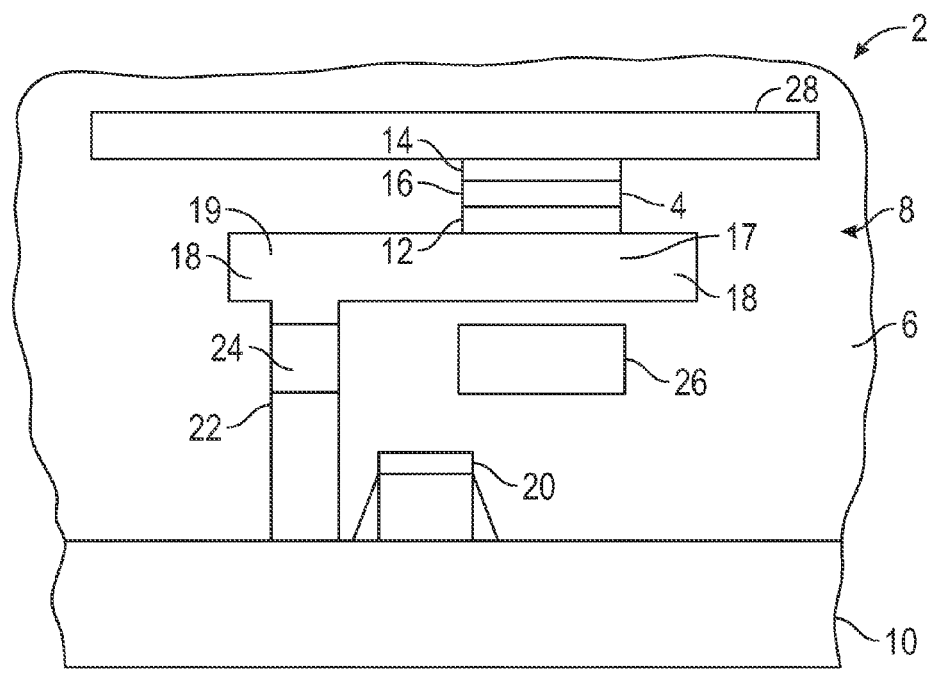
FIG. 1 illustrates, in cross-sectional view, a prior art integrated circuit that includes a magnetic tunnel junction (MTJ) for a magnetoresistive random-access memory (MRAM)
Figure 2:
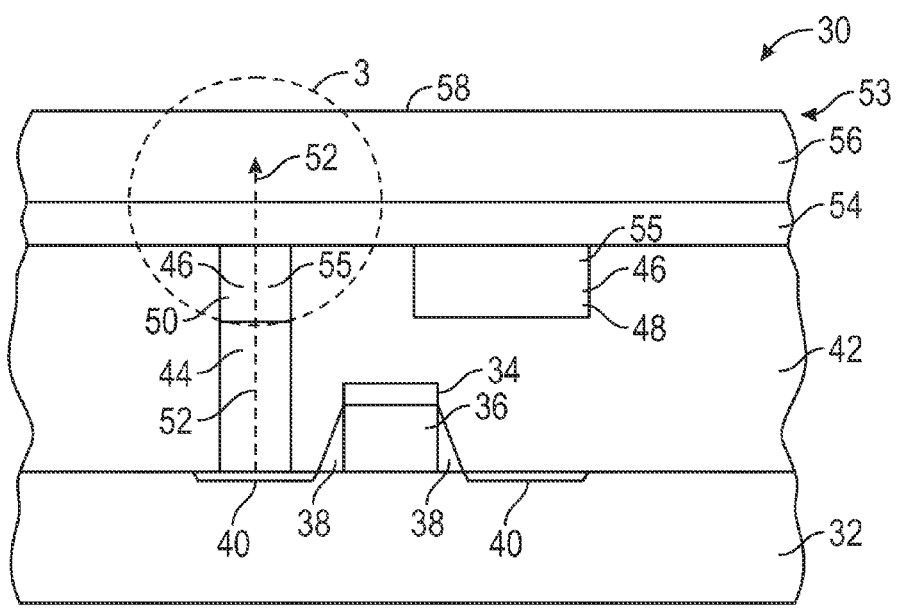
FIGS. 2-15 illustrate, in cross-sectional views, an integrated circuit and a method for fabricating an integrated circuit during various intermediate fabrication stages in accordance with exemplary embodiments.

FIG. 2 illustrates a portion of an IC 30 during an intermediate fabrication stage in accordance with an exemplary embodiment. The IC 30 includes a semiconductor substrate 32. As used herein, the term 'semiconductor substrate' will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, 'semiconductor material' encompasses other materials such as relatively pure and impurity-doped germanium, gallium arsenide, zinc oxide, glass, and the like. An exemplary semiconductor material is a silicon substrate. The silicon substrate may be a bulk silicon wafer or may be a thin layer of silicon on an insulating layer (commonly known as silicon-on-insulator or SOI) that, in turn, is supported by a carrier wafer.

As illustrated, a MOS transistor 34, which can be N-channel or P-channel MOS transistor, is formed on the semiconductor substrate 32. Although the term "MOS transistor" properly refers to a semiconductor device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate.

The MOS transistor 34 may be formed on the basis of the following exemplary processes. After providing the semiconductor substrate 32, basic doping of an active region of the semiconductor substrate 32 designated for the MOS transistor 34 is established, for instance, by ion implantation. The process continues by forming a gate insulating layer (not shown) and a gate electrode structure 36 that overlies the gate insulating layer on the basis of oxidation and/or deposition techniques followed by the deposition of a gate electrode material that is patterned using lithography and etch techniques. Sidewall spacers 38 are formed along the gate electrode structure 36 on the basis of oxidation and/or deposition techniques. The sidewall spacers 38 are further defined in accordance with process and device requirements so as to act as an implantation mask, at least at various fabrication stages of the implantation sequences, to establish the desired vertical and lateral dopant profiles for source and drain regions 40 and the desired offset to a channel region formed therebetween. Thereafter, one or more annealing processes may be performed to activate the dopants.

As illustrated in FIG. 2, above the semiconductor substrate 32 and the MOS transistor 34, the IC 30 includes one or more interlayer dielectric (ILD) layer(s) 42 of dielectric material (e.g., silicon dioxide, silicon nitride, silicon oxynitride or the like). Arranged in the ILD layer(s) 44 is a conductive stud 44 (e.g., a highly conductive stud containing copper or the like) and a metallization layer 46 that includes a metal line 48 and a metal interconnect 50 that form part of the conductive stud 44. The conductive stud 44 is electrically coupled to the source or drain region 40 of the MOS transistor 34 and extends substantially perpendicular to the semiconductor substrate 32 along a normal axis (indicated by dashed arrow 52). In an exemplary embodiment, depending upon the number of interposing metallization layers (not shown) between the semiconductor substrate 32 and the metallization layer 46, the conductive stud 44 may include one or more conductive vias that are connected to a conductive portion(s) of the interposing metallization layer(s) to form a conductive column. As illustrated, the metal interconnect 50 is part of the metallization layer 46. However, it is to be understood that the metal interconnect 50 could alternatively be a conductive via formed as the upper portion of the conductive stud 44 either above or below the metallization layer 46. While only one metal line 48 along with the metal interconnect 50 are shown in FIG. 2 for illustrative purposes, it is to be appreciated that the metallization layer 46 can include a plurality of discrete and spaced apart metal lines similarly configured to the metal line 48 that form part of a BEOL interconnect structure 53 that is disposed above the semiconductor substrate 32. In an exemplary embodiment, the metal line 48 and the metal interconnect 50 are formed of a conductive metal fill 55 such as copper, copper alloy, or the like. Additionally, the metal line 48 and/or the metal interconnect 50 may include a barrier/liner (not shown) of one or more layers of a barrier- and/or liner-forming material(s) such as tantalum (Ta), tantalum nitride (TaN), titanium (Ti), and/or titanium nitride (TiN) to help inhibit or prevent diffusion of the conductive metal fill 55 into the ILD layer(s) 42 and/or to help hold the conductive metal fill 55 to the ILD layer(s) 42.

In an exemplary embodiment, overlying the ILD layer(s) 42 and the metallization layer 46 is an N-doped silicon carbide (SiCN) layer 54. A dielectric layer 56 of dielectric material (e.g., silicon dioxide, silicon nitride, silicon oxynitride or the like) overlies the N-doped SiCN layer 54.

The illustrated portion of the BEOL interconnect structure 53 may be formed on the basis of well-known techniques. In an exemplary embodiment, the ILD layer(s) 42 is formed by depositing a dielectric material such as silicon dioxide or the like that includes some impurities (e.g., carbon or the like) overlying the semiconductor substrate 32 using a chemical vapor deposition (CVD) process and treating the dielectric material for example with UV radiation to out gas the impurities and form porosity in the ILD layer(s) 42 to further lower the dielectric constant of the dielectric material. The top surface of the ILD layer(s) 42 is planarized using a chemical mechanical planarization (CMP) process. Next, the ILD layer(s) 42 is patterned and etched using, for example, a dry etching process to form trenches. The trenches are then filled by depositing a barrier/liner-forming material(s) and the conductive metal fill 55 using a physical vapor deposition (PVD) process (or an atomic layer deposition (ALD) process) and an electrochemical plating (ECP) process, respectively, to form at least a portion of the conductive stud 44 (e.g., the metal interconnect 50) and the metal line 48. Any overburden of the conductive metal fill 55 and/or barrier/liner-forming material(s) is removed by CMP. Next, the N-doped SiCN layer 54 is deposited overlying the ILD layer(s) 42 using a CVD process. The dielectric layer 56 is then formed (e.g., via depositing and treating a dielectric material as discussed above in relation to the ILD layer(s) 42) over the N-doped SiCN layer 54 followed by CMP to expose an upper surface portion 58 of the dielectric layer 56.

Figure 3:
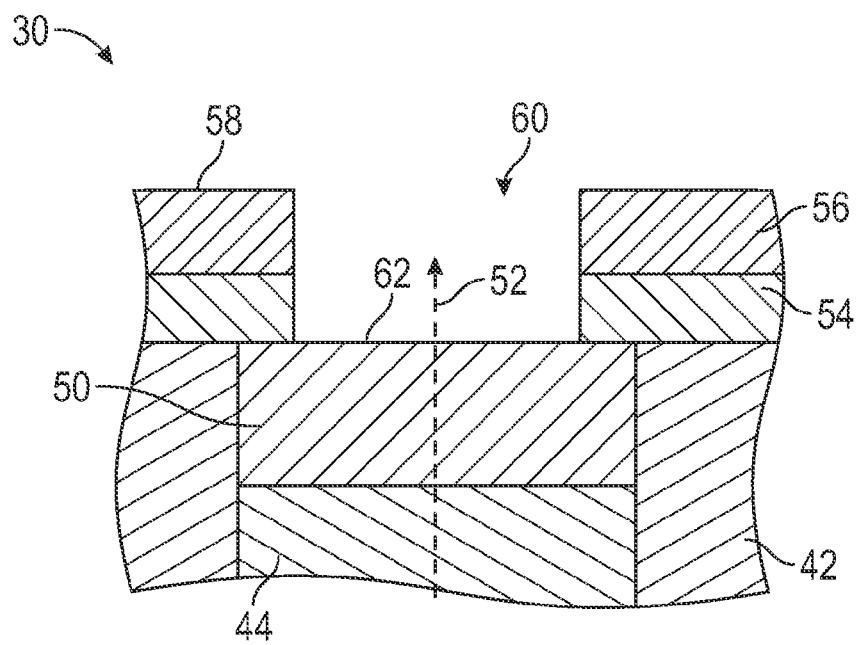

FIGS. 3-13 illustrate enlarged sectional views of the IC 30 depicted in portion 3 of FIG. 2 during further advanced fabrication stages in accordance with an exemplary embodiment. Referring to FIG. 3, a hole is etched through the dielectric layer 56 and the N-doped SiCN layer 54 to expose an upper surface portion 62 of the metal interconnect 50. The hole 60 is formed using well-known lithography and etching techniques (e.g., dry etching techniques such as plasma etching or the like) to selectively remove portions of the dielectric layer 56 and the N-doped SiCN layer 54.

Figure 4:
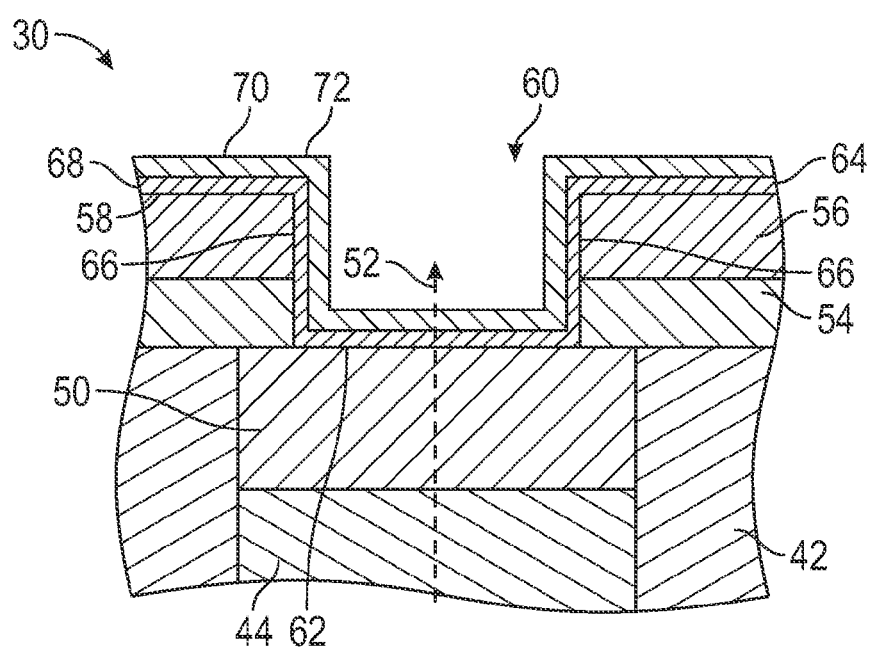

The process continues as illustrated in FIG. 4 by forming a barrier layer 64 overlying the upper surface portion 58 of the dielectric layer 56 and into the hole 60 overlying sidewalls 66 of the dielectric layer 56 and the N-doped SiCN layer 54, and the upper surface portion 62 of the metal interconnect 50. In an exemplary embodiment, the barrier layer 64 is formed by depositing a barrier-forming material 68 into the hole 60 and overlying the upper surface portion 58 of the dielectric layer 56 that is laterally adjacent to the hole 60 using an ALD process, a CVD process, or a PVD process. In an exemplary embodiment, the barrier-forming material 68 includes TaN and has a thickness of from about 10 to about 200 Å.

A liner layer 70 of liner-forming material 72 is deposited overlying the barrier layer 64 including into the hole 60 overlying the sidewalls 66 and the upper surface portion 62 of the metal interconnect 50. In an exemplary embodiment, the liner-forming material 72 includes tantalum (Ta) or cobalt (Co) and is deposited by a PVD or CVD process. In an exemplary embodiment, the liner layer 70 has a thickness of from about 10 to about 200 Å.

Figure 5:
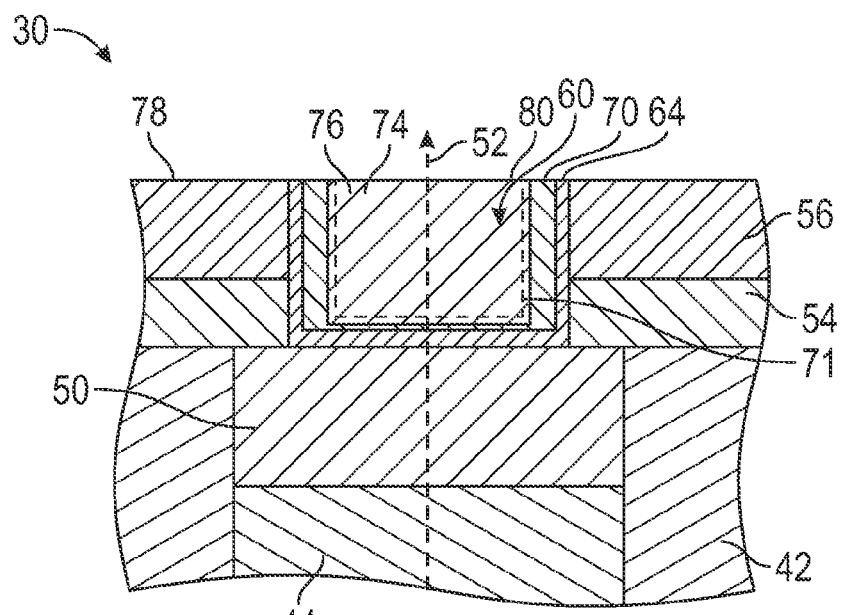

Referring to FIG. 5, a conductive metal plug 74 is formed in the hole 60 overlying the barrier and liner layers 64 and 70 and aligned with the normal axis 52. In an exemplary embodiment, the conductive metal plug 74 is formed of a highly conductive metal such as copper, a copper alloy, or a combination thereof. In an exemplary embodiment, the conductive metal plug 74 is formed by depositing a conductive metal seed layer 71, e.g., copper seed layer, overlying the liner layer 70 using, for example, a PVD process. A remaining portion of the hole 60 is filled with a conductive metal fill 76, e.g., copper or copper alloy fill, using, for example, an electrochemical plating (ECP) process. The process continues by planarizing the IC 30 using a CMP process to remove any overburden of the conductive metal fill 76 and portions of the barrier and liner layers 64 and 70 that overlie the upper surface portion 58 of the dielectric layer 56 (shown in FIG. 4) to expose upper surface portions 78 and 80 of the dielectric layer 56 and the conductive metal plug 74, respectively. In an exemplary embodiment, the conductive metal plug 74 has a thickness of from about 10 to about 500 nm and a width of from about 10 to about 500 nm.

Figure 6:
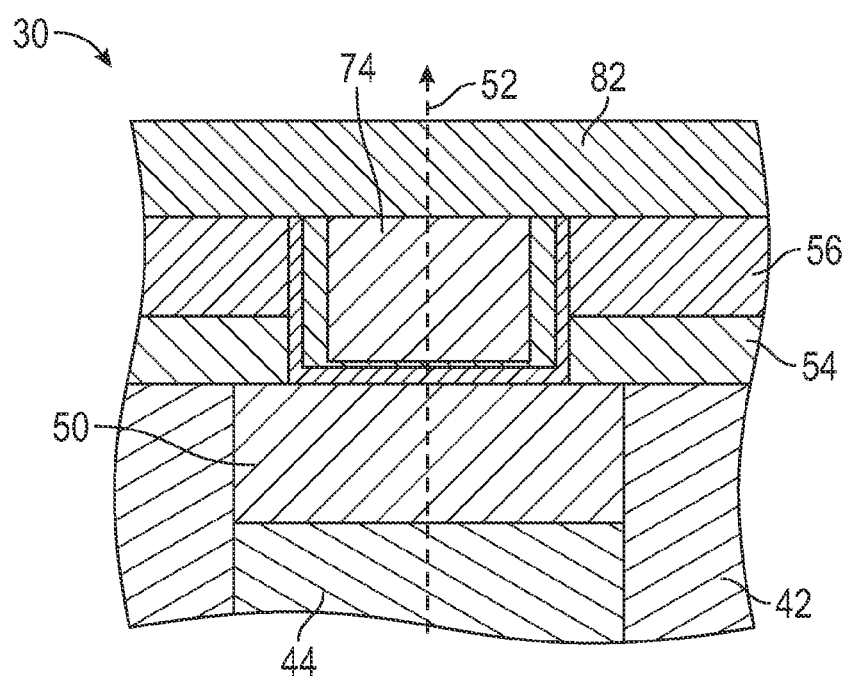
Figure 7:
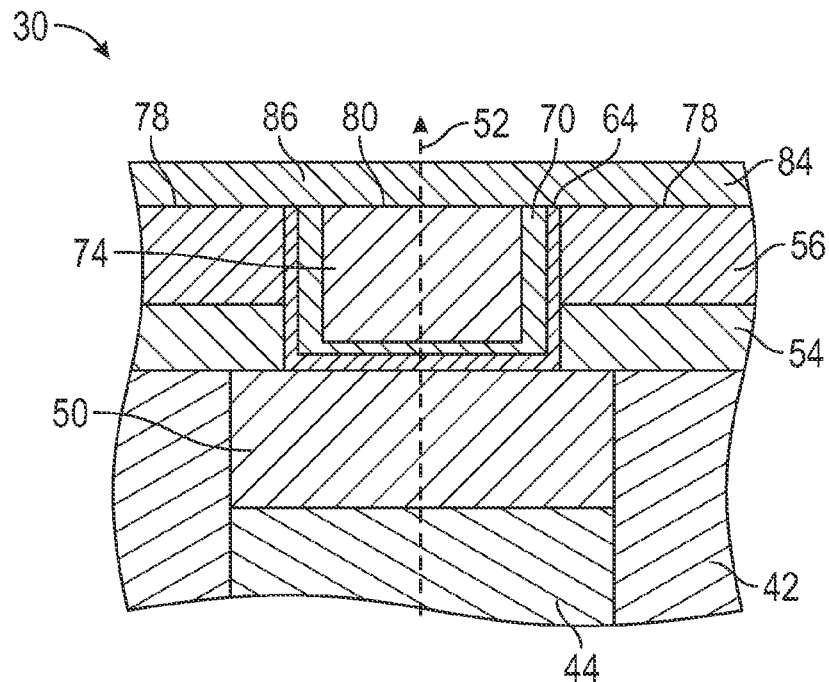

The process continues as illustrated in FIGS. 6-7 by depositing a tantalum-containing layer 82 overlying the conductive metal plug 74. In an exemplary embodiment, the tantalum-containing layer 82 is formed of tantalum and is deposited by a PVD process. As illustrated, the tantalum-containing layer 82 is deposited on the upper surface portions 78 and 80 of the dielectric layer 56 and the conductive metal plug 74, respectively, and is subsequently planarized using a CMP process to form a tantalum-containing layer 84 as shown in FIG. 7. In an exemplary embodiment, the tantalum-containing layer 84 has a thickness of from about 1 to about 50 nm. Together the barrier and liner layers 64 and 70, the conductive metal plug 74, and the tantalum-containing layer 84 form a lower electrode 86.

Figure 8:
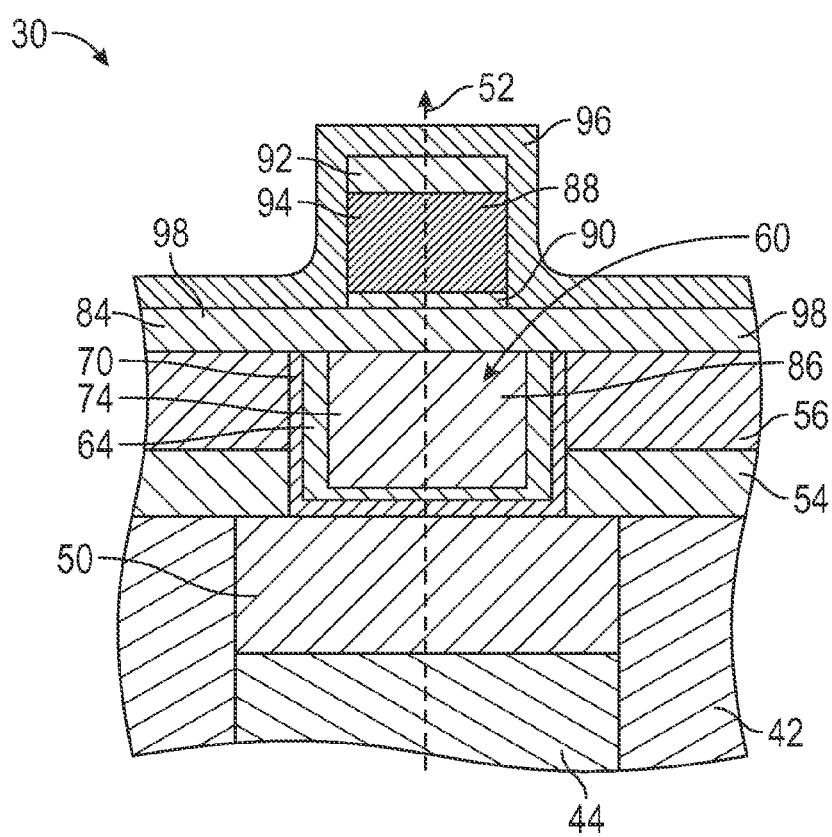

FIG. 8 illustrates the IC 30 during further advanced fabrication stage in accordance with an exemplary embodiment. As illustrated, in an exemplary embodiment, a MTJ stack 88 is formed on the lower electrode 86 aligned with the normal axis 52. The MTJ stack 88 includes a pinned layer 90, a free layer 92, and an insulating layer 94 that is arranged between the pinned layer 90 and the free layer 92. The MTJ stack 88 is formed by sequentially depositing pinned layer-, insulating layer-, and free layer-forming materials on the basis of well-known deposition techniques followed by patterning using well-known lithography and etch techniques. In one embodiment, the insulating layer 94 is a thin (e.g., from about 1 to about 2 nm in thickness) oxide layer such as silicon oxide or magnesium oxide, the pinned layer 90 is formed of one or more layers of platinum-manganese, iridium-manganese, nickel-manganese, and/or iron-manganese, and the free layer 92 may be formed of cobalt-iron-boron, for example. Other possible MTJ stacks configurations are known in the art, and may be suitable for use herein.

As illustrated, a passivation layer 96 is formed overlying the MTJ stack 88 and outer lateral portions 98 of the tantalum-containing layer 84 of the lower electrode 86 that overlie the dielectric layer 56 laterally adjacent to the hole 60. In an exemplary embodiment, the passivation layer 96 functions as a dielectric barrier/protective cap over the MTJ stack 88 and the exposed portions of the lower electrode 86. Exemplary materials for the passivation layer include silicon carbide, silicon nitride, silicon oxide, and a combination thereof. In an exemplary embodiment, the passivation layer 96 is deposited using a CVD process or the like.

Figure 9:
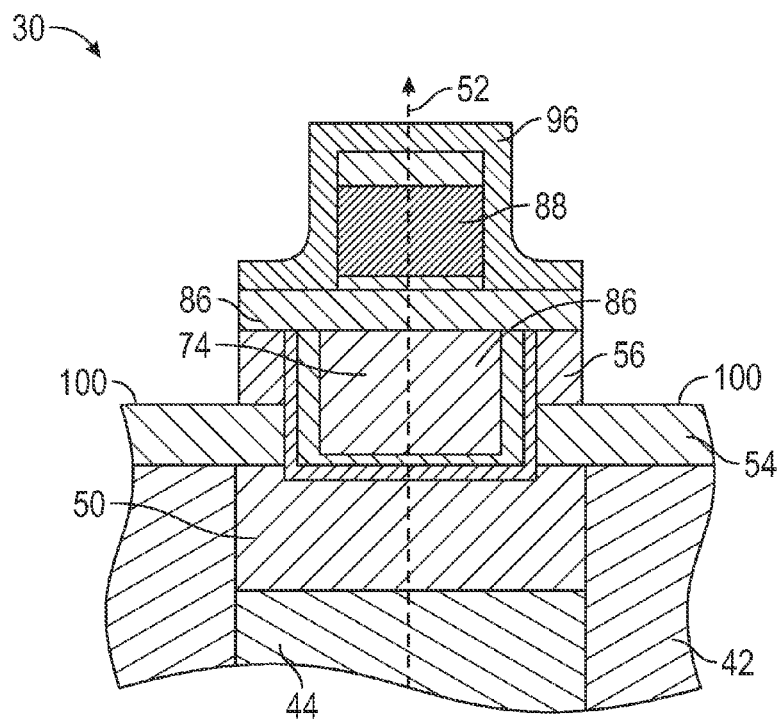

The process continues by etching the outer lateral portions 98 of the tantalum-containing layer 84 of the lower electrode 86 along with the corresponding overlying portions of the passivation layer 96 and the corresponding underlying portions of the dielectric layer 56 to expose portions 100 of the N-doped SiCN layer 54 as illustrated in FIG. 9. In an exemplary embodiment, selective etching of the outer lateral portions 98 of the lower electrode 86 and the corresponding overlying and underlying materials is accomplished on the basis of using well-known lithography and etching techniques (e.g., dry etching techniques such as plasma etching or the like).

Figure 10:
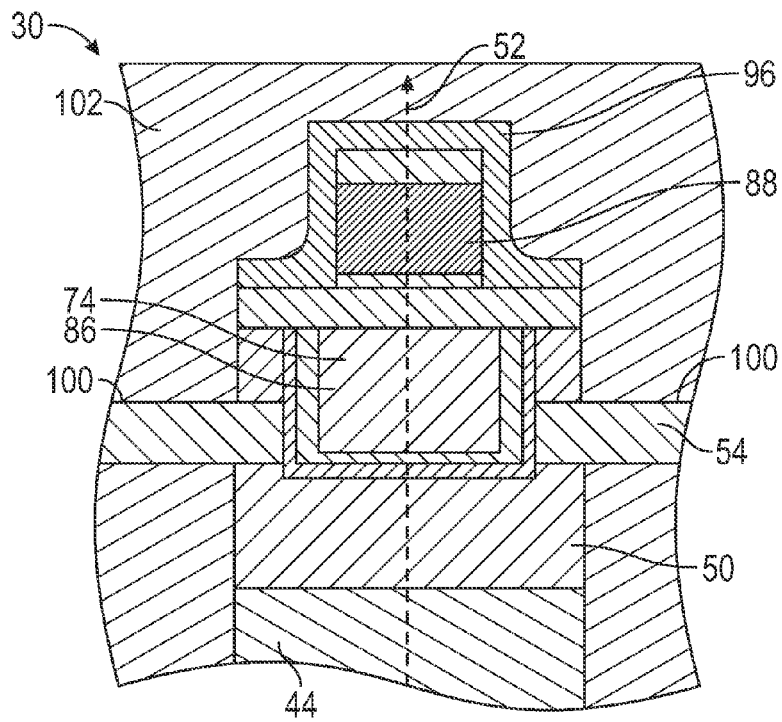
Figure 11:
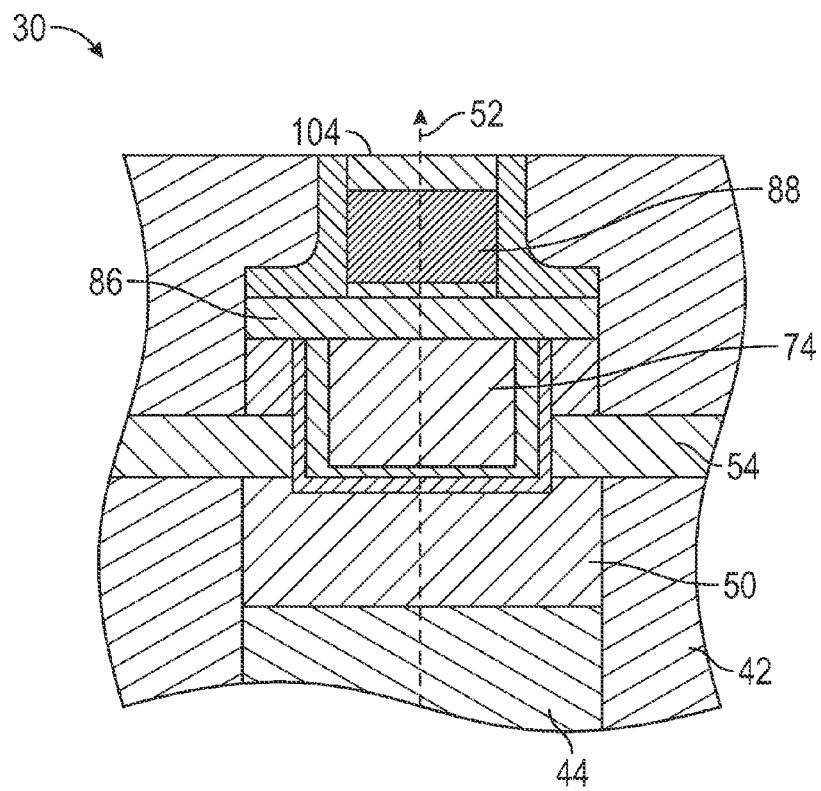
Figure 12:
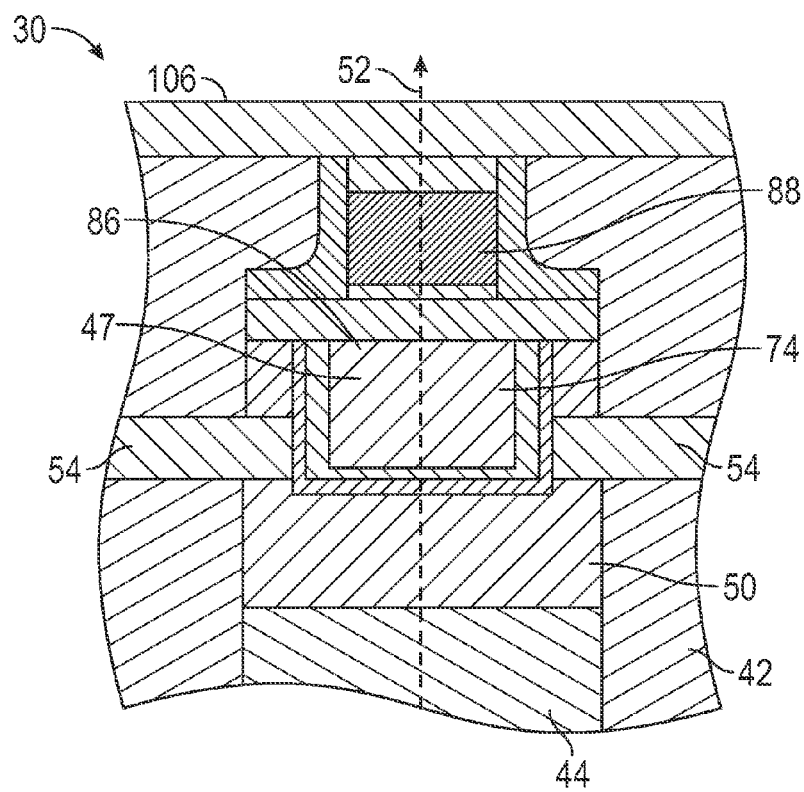

The process continues as illustrated in FIG. 10 by forming an ILD layer 102 of dielectric material (e.g., silicon dioxide or the like deposited by a CVD process or the like) overlying the passivation layer 96 and the portions 100 of the N-doped SiCN layer 54. In an exemplary embodiment, the top surface of the ILD layer 102 is planarized to the upper surface 104 of the MTJ stack 88 as illustrated in FIG. 11 using, for example, a CMP process. Next, a N-doped SiCN layer 106 is deposited overlying the ILD layer 102 as illustrated in FIG. 12.

Figure 13:
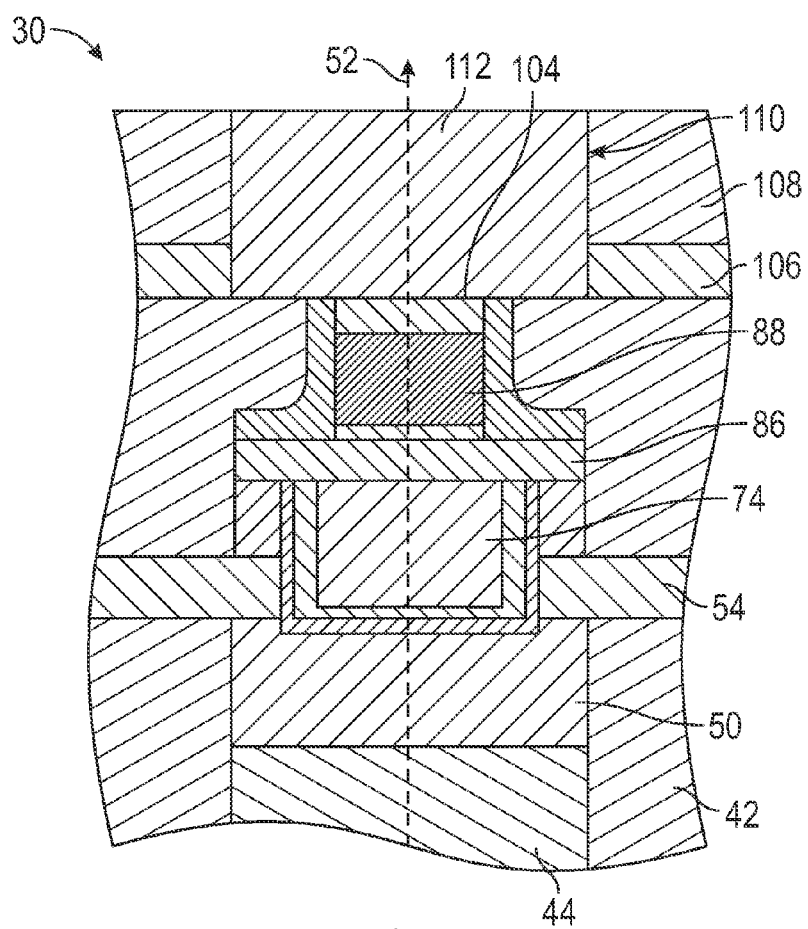

FIG. 13 illustrates the IC 30 during further advanced fabrication stage in accordance with an exemplary embodiment. The process continues by forming an ILD layer 108 of dielectric material (e.g., silicon dioxide or the like deposited by a CVD process or the like) overlying the N-doped SiCN layer 106. Next, the ILD layer 108 and the N-doped SiCN layer 106 are patterned and etched using, for example, a dry etching process to form a metal line trench 110 that exposes the upper surface 104 of the MTJ stack 88. The metal line trench 110 is then filled by depositing barrier-, liner-forming materials and a conductive metal seed and fill (e.g., copper) into the metal line trench 110 using, for example, one or more PVD processes (and/or ALD processes and/or CVD processes) and an ECP process, respectively, to form a metal line 112. Any overburden is removed by CMP. As illustrated, in an exemplary embodiment, the metal line 112 is disposed directly over the MTJ stack 88 aligned with the normal axis 52.

Figure 14:
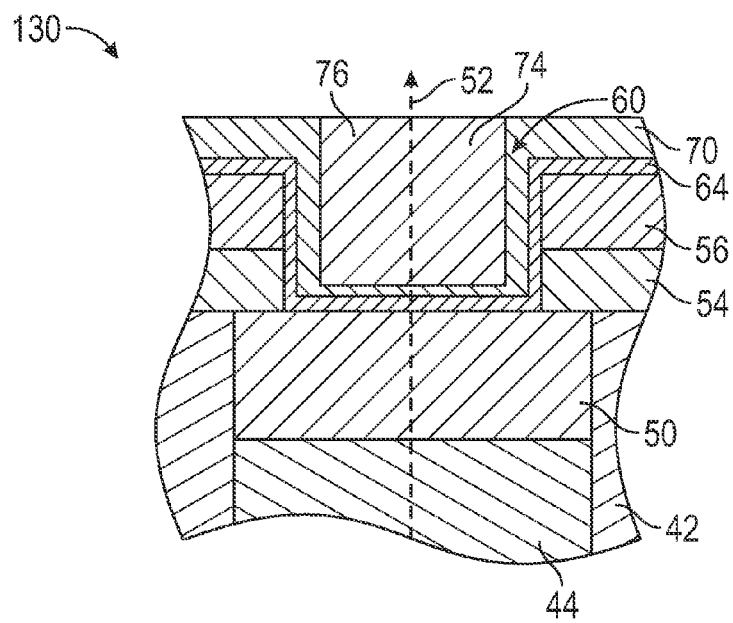

In accordance with another exemplary embodiment, FIG. 14 illustrates the IC 130 similarly configured to the IC 30 as illustrated in FIG. 5 including the ILD layer(s) 42, the conductive stud 44 including the metal interconnect 50, the N-doped SiCN layer 54, the dielectric layer 56, the barrier layer 64, the liner layer 70, and the conductive metal plug 74 but with the exception that the IC 130 is planarized using, for example a CMP process, to remove any overburden conductive metal fill 76 and the liner layer 70 while leaving the barrier layer 64 and optionally some of the liner layer 70 intact particularly along the upper surface of the dielectric layer 56 that is laterally adjacent to the hole 60.

Figure 15:
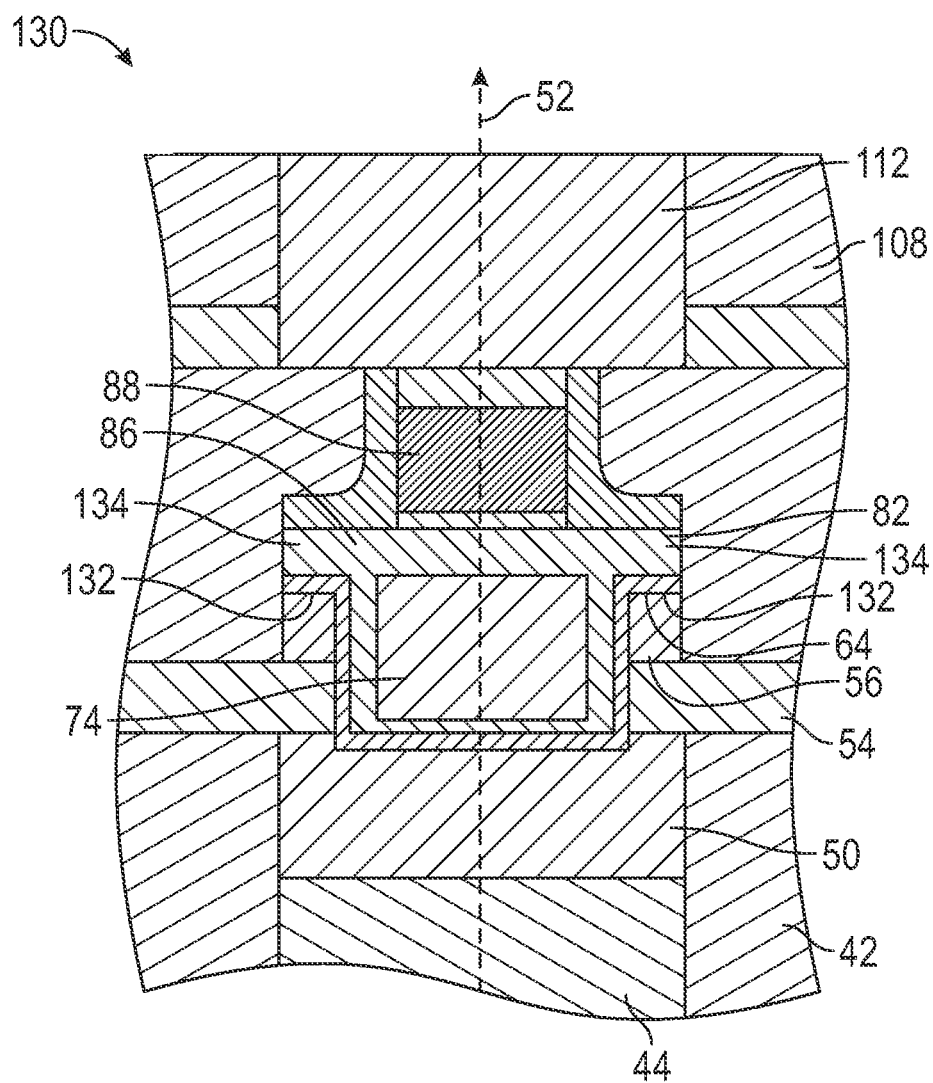

Referring to FIG. 15, in an exemplary embodiment, the process continues for the IC 130 similarly to the process for the IC 30 as discussed in relation to FIGS. 6-13 with the exception of leaving overhanging portions 132 and 134 of the barrier layer 64 and the tantalum-containing layer 82 that overlie the dielectric layer 56 intact to improve adhesion between the dielectric layer 56 and the lower electrode 86.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit that includes a magnetic tunnel junction (MTJ) for a magnetoresistive random-access memory (MRAM), the method comprising:
    forming a metal interconnect above a semiconductor substrate and aligned with a normal axis substantially perpendicular to the semiconductor substrate, wherein the metal interconnect has an upper surface including a central portion and an outer portion;
    forming a lower electrode on the central portion of the upper surface of the metal interconnect and aligned with the normal axis, wherein the lower electrode comprises a conductive metal plug;
    forming a MTJ stack on the lower electrode aligned with the normal axis, wherein the MTJ stack has a top surface, a bottom surface, and opposite side surfaces extending from the bottom surface to the top surface;
    depositing a passivation layer directly on the top surface and the opposite side surfaces of the MTJ stack and forming the passivation layer with an upper surface having an uppermost segment directly overlying the MTJ stack, lowermost segments adjacent to the MTJ stack, and vertically-extending segments extending from the uppermost segment to the lowermost segments; and
    depositing an interlayer dielectric material directly on the uppermost segment, the vertically-extending segments, and the lowermost segments of the upper surface of the passivation layer.

2. The method of claim 1, further comprising:
    depositing a dielectric over the metal interconnect, wherein forming the lower electrode comprises forming the lower electrode in the dielectric, and wherein the conductive metal plug and the dielectric form an upper surface; and forming a tantalum-containing layer directly on the upper surface of the conductive metal plug and the dielectric; wherein depositing the passivation layer directly on the top surface and the opposite side surfaces of the MTJ stack comprises depositing the passivation layer directly on the tantalum-containing layer.

3. The method of claim 2 further comprising etching lateral portions of the passivation layer, the tantalum-containing layer, and the dielectric to form a vertically-extending sidewall separated from the conductive metal plug by a distance equal to a thickness of a remaining portion of the dielectric adjacent the conductive metal plug.

4. The method of claim 3 wherein depositing the interlayer dielectric material comprises depositing the interlayer dielectric material directly on the vertically-extending sidewall formed by the passivation layer, the tantalum-containing layer, and the dielectric, and directly on an upper surface of the passivation layer.

5. The method of claim 3 wherein the upper surface of the conductive metal plug is located at a first height from the metal interconnect, and wherein a bottom surface of the interlayer dielectric material is located at a second height from the metal interconnect less than the first height.

6. The method of claim 1 further comprising etching lateral portions of the passivation layer to form the passivation layer with vertically-extending end walls separated from the vertically-extending segments of the upper surface of the passivation layer by the lowermost segments of the upper surface of the passivation layer.

7. The method of claim 6 further comprising depositing an interlayer dielectric material directly on the vertically-extending end walls of the passivation layer and directly on the uppermost segment, the vertically-extending segments, and the lowermost segments of the upper surface of the passivation layer.

8. The method of claim 1, further comprising:
   depositing a dielectric over the metal interconnect, wherein forming the lower electrode comprises forming the lower electrode in the dielectric, and wherein the conductive metal plug and the dielectric form an upper surface;
   recessing outer portions of the dielectric to a recessed surface below the upper surface of the conductive metal plug to form recesses separated from the conductive metal plug by inner portions of the dielectric.

9. A method for fabricating an integrated circuit that includes a magnetic tunnel junction (MTJ) for a magnetoresistive random-access memory (MRAM), the method comprising:
   forming a metal interconnect above a semiconductor substrate and aligned with a normal axis substantially perpendicular to the semiconductor substrate, wherein the metal interconnect has an upper surface including a central portion and an outer portion;
   depositing a dielectric over the metal interconnect;
   forming a lower electrode in the dielectric and on the central portion of the upper surface of the metal interconnect and aligned with the normal axis, wherein the lower electrode comprises a conductive metal plug;
   forming a MTJ stack on the lower electrode aligned with the normal axis; and
   recessing outer portions of the dielectric to a recessed surface lower than the upper surface of the conductive metal plug to form recesses separated from the conductive metal plug by inner portions of the dielectric.

10. The method of claim 9 wherein the method comprises recessing the outer portions of the dielectric to the recessed surface lower than the upper surface of the conductive metal plug after forming the MTJ stack on the lower electrode.

11. The method of claim 9 wherein the recessed surface is higher than an upper surface of the metal interconnect.

12. The method of claim 9 wherein the recessed surface is higher than an upper surface of the metal interconnect, and wherein the recessed surface is not directly over the metal interconnect.

13. The method of claim 9 wherein the recessed surface consists of an upper surface of dielectric material.

14. The method of claim 9 further comprising depositing an interlayer dielectric material directly on the recessed surface.

15. An integrated circuit that includes a magnetic tunnel junction (MTJ) for a magnetoresistive random-access memory (MRAM), the integrated circuit comprising:
   a semiconductor substrate;
   a metal interconnect disposed above the semiconductor substrate and aligned with a normal axis substantially perpendicular to the semiconductor substrate, wherein the metal interconnect has an upper surface including a central portion and an outer portion;
   a lower electrode disposed on the central portion of the upper surface of the metal interconnect and comprising a conductive metal plug;
   a dielectric material disposed on the outer portion of the upper surface of the metal interconnect;
   a magnetic tunnel junction (MTJ) stack disposed on the lower electrode aligned with the normal axis, wherein the MTJ stack includes:
      a pinned layer material;
      an insulating layer material directly on the pinned layer material; and
      a free layer material directly on the insulating layer material; and
   a passivation layer overlying the MTJ stack and directly on a top surface of the free layer material.

16. The integrated circuit of claim 15 wherein the MTJ stack includes vertically-extending sidewalls formed by the pinned layer material, the insulating layer material, and the free layer material, and wherein the passivation layer directly contacts the vertically-extending sidewalls.

17. The integrated circuit of claim 16 further comprising a tantalum-containing layer directly on the lower electrode, wherein the MTJ stack is directly on the tantalum-containing layer.

18. The integrated circuit of claim 17 wherein the passivation layer directly contacts an upper surface of the tantalum-containing layer and encapsulates the MTJ stack.

* * * * *